United States Patent
Kang et al.

(10) Patent No.: US 9,278,545 B2
(45) Date of Patent: Mar. 8, 2016

(54) LIGHT EMITTING DIODE INTEGRATED WITH LENS, LINE PRINTER HEAD, AND METHOD OF MANUFACTURING THE LIGHT EMITTING DIODE

(75) Inventors: Seok-Jin Kang, Suwon-Si (KR); Hyung Choi, Seongnam-Si (KR); Eung-Yeoul Yoon, Suwon-Si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 135 days.

(21) Appl. No.: 12/805,893

(22) Filed: Aug. 23, 2010

(65) Prior Publication Data

US 2011/0045620 A1    Feb. 24, 2011

(30) Foreign Application Priority Data

Aug. 21, 2009    (KR) .................. 10-2009-0077633

(51) Int. Cl.
| | | |
|---|---|---|
| H01L 29/18 | (2006.01) | |
| B41J 2/45 | (2006.01) | |
| H01L 33/20 | (2010.01) | |
| H01L 33/00 | (2010.01) | |
| H01L 33/58 | (2010.01) | |

(52) U.S. Cl.
CPC .............. B41J 2/451 (2013.01); H01L 33/20 (2013.01); *H01L 33/0079* (2013.01); *H01L 33/58* (2013.01)

(58) Field of Classification Search
CPC .......... B41J 2/451; H01L 33/20; H01L 33/58; H01L 33/0079

USPC .......... 257/98, E33.072, E33.073, 88; 438/29
See application file for complete search history.

(56) References Cited

U.S. PATENT DOCUMENTS

| | | | |
|---|---|---|---|
| 7,084,432 B2 | | 8/2006 | Kachi et al. |
| 2003/0063783 A1* | | 4/2003 | Higuchi ................. 382/125 |
| 2004/0041220 A1* | | 3/2004 | Kwak et al. ............. 257/432 |
| 2005/0117347 A1* | | 6/2005 | Melpignano et al. ..... 362/309 |
| 2006/0279949 A1* | | 12/2006 | Shin et al. .............. 362/236 |
| 2007/0215886 A1* | | 9/2007 | Takeuchi et al. ......... 257/94 |
| 2007/0284564 A1* | | 12/2007 | Biwa et al. .............. 257/13 |
| 2008/0080897 A1* | | 4/2008 | Gomi ..................... 399/221 |
| 2008/0251808 A1* | | 10/2008 | Kususe et al. ............ 257/98 |
| 2009/0278144 A1* | | 11/2009 | Sonobe et al. ............ 257/98 |
| 2015/0125979 A1 | | 5/2015 | Kwak et al. |

FOREIGN PATENT DOCUMENTS

| | | |
|---|---|---|
| JP | 02-040935 | 2/1990 |
| JP | 2740683 | 4/1998 |
| JP | 10-2007-0098108 | 2/2004 |

(Continued)

OTHER PUBLICATIONS

Korean Patent Non-Final Rejection Office Action issued in Korean Patent Application No. 10-2009-0077633 dated Jun. 15, 2015 (total 10 pages).

*Primary Examiner* — Vongsavanh Sengdara
(74) *Attorney, Agent, or Firm* — Staas & Halsey LLP

(57) ABSTRACT

Provided are a light emitting diode unit including a light emitting diode integrated with a lens, a line printer head using the light emitting diode, and a method of manufacturing the light emitting diode. The light emitting diode unit includes the light emitting diode layer bonded to a transparent substrate after removing a growth substrate on which the light emitting layer is grown, and a lens that refracts light emitted from the light emitting diode is formed on the transparent substrate.

17 Claims, 11 Drawing Sheets

(56) References Cited

FOREIGN PATENT DOCUMENTS

| JP | 2004-56010 | 2/2004 |
|----|------------|--------|
| KR | 10-2004-0021028 | 3/2004 |
| KR | 20-2004-0021028 | 3/2004 |
| KR | 10-2007-0098108 | 10/2007 |

* cited by examiner

LIGHT EMITTING DIODE INTEGRATED WITH LENS, LINE PRINTER HEAD, AND METHOD OF MANUFACTURING THE LIGHT EMITTING DIODE

CROSS-REFERENCE TO RELATED APPLICATION

This application claims the benefit of Korean Patent Application No. 10-2009-0077633, filed on Aug. 21, 2009, in the Korean Intellectual Property Office, the disclosure of which is incorporated herein in its entirety by reference.

BACKGROUND

1. Field

The embodiment relates to a light emitting diode integrated with a lens, a line printer head using the light emitting diode, and a method of manufacturing the light emitting diode.

2. Description of the Related Art

Light emitting diodes are a PN junction of compound semiconductors which emit light upon receiving a current. Unlike other light sources which use a filament, a light emitting diode does not have the problem of a short circuit caused by oxidization or heating. Also, the light emitting diode is an environment-friendly device which has a long lifespan and is driven with low power consumption. In addition, the light emitting diode has a high response speed of simultaneously responding to an applied current, and has excellent durability against temperature and shocks, and is manufactured in a semiconductor manufacturing process which is a batch process, and thus may be easily made compact and integrated.

With the commercialization of blue light emitting diodes, natural colors can be realized, and thus a light emitting diode is widely used not only in simple display devices (as previously used) but also in backlight units (BLU) of mobile phones, flat panel displays, outdoor electric signs, gauge boards of cars, taillights, traffic signals, lightscape lights, etc., and also in the environmental field or biotechnology in which water pollution or oxygen density in blood is measured. Furthermore, due to the improved product performance and reduced manufacturing costs, the application fields of light emitting diodes have gradually extended, and thus the light emitting diodes are also used as alternative illumination for home fluorescent lamps. Recently, as electrophotographic image forming apparatuses have high speed and high image quality, a line printer head (LPH) that uses a light emitting diode as a light source in order to overcome the limits of a laser scanning unit (LSU), which is a conventional exposure apparatus, has been developed. The LPH includes thousands of light emitting diodes arranged at intervals of several tens of microns, and each of the light emitting diodes changes light energy according to printing image data to transmit the printing image data to a photoreceptor that is disposed at a distance of several millimeters away from the light emitting diodes. In a conventional LPH, an optical system, which prevents lights emitted from adjacent light emitting diodes from overlapping, is further included.

SUMMARY

It is an aspect of the embodiment to provide a light emitting diode integrated with a lens that collimates emitted light or focuses light at a far distance, a line printer head (LPH) that uses the light emitting diode, and a method of manufacturing the light emitting diode.

Additional aspects and/or advantages will be set forth in part in the description which follows and, in part, will be apparent from the description, or may be learned by practice of the invention.

The foregoing and/or other aspects may be achieved by providing a light emitting diode unit including: a light emitting diode; a transparent substrate bonded to the light emitting diode; and a lens that refracts light emitted from the light emitting diode, the lens being formed on the transparent substrate.

The light emitting diode may include a compound semiconductor layer that is grown on an opaque substrate and then separated from the opaque substrate.

The opaque substrate may be a GaAs substrate.

The light emitting diode may emit red light.

The light emitting diode may include: a first conductivity compound semiconductor layer bonded to the transparent substrate; an active layer formed on the first conductivity compound semiconductor layer; and a second conductivity compound semiconductor layer formed on the active layer.

The light emitting diode may be covered by a reflection layer.

The light emitting diode may include: a first electrode layer formed on a portion of the first conductivity compound semiconductor layer; and a second electrode layer formed on the second conductivity compound semiconductor layer.

The second electrode layer may cover a remaining portion of the first conductivity compound semiconductor layer except at the portion where the first electrode layer is formed, and an insulating layer is provided beneath the second electrode layer except at a portion where the second electrode layer contacts an upper surface of the second conductivity compound semiconductor layer.

A reflection layer may be inserted into the second conductivity compound semiconductor layer.

The light emitting diode may include a truncated pyramid shape.

The lens may have refractive power as a surface of the transparent substrate is curved. The lens may be formed of a polymer layer by molding the polymer layer and attaching the polymer layer to the transparent substrate. The lens may have refractive power as impurities have different densities according to positions in the transparent substrate.

A plurality of the light emitting diodes may be arranged on the transparent substrate. The plurality of light emitting diodes may be arranged in a row or in a plurality of rows.

The lens may include a micro-lens array which corresponds to the light emitting diodes that are arranged on the transparent substrate.

The foregoing and/or other aspects may be achieved by providing a line printer head exposing a photoreceptor in a main scanning direction, comprising the above-described light emitting diode unit.

The foregoing and/or other aspects may be achieved providing an electrophotographic image forming apparatus including: a photoreceptor; the above-described line printer head, which illustrates light onto an exposed surface of the photoreceptor to form an electrostatic latent image; and a developing unit supplying toner to the electrostatic latent image formed on the photoreceptor to develop the electrostatic latent image.

The foregoing and/or other aspects may be achieved by providing a method of manufacturing a light emitting diode unit, the method including: growing a light emitting diode layer on an opaque substrate; forming a transparent substrate having a lens formed on a surface; bonding an upper surface of the light emitting diode layer to a surface of the transparent substrate on which the lens is not formed; removing the opaque substrate from the light emitting diode layer; and forming an electrode layer structure on the light emitting diode layer.

The lens of the transparent substrate may be formed using a fusion molding method, a photolithography method, an imprinting method, or an impurity diffusion method.

The foregoing and/or other aspects may be achieved by providing a method of manufacturing a light emitting diode unit, the method comprising: growing a light emitting diode layer on an opaque substrate; bonding an upper surface of the light emitting diode layer to a transparent substrate; removing the opaque substrate from the light emitting diode layer; forming an electrode layer structure on the light emitting diode layer; and forming a lens on a surface of the transparent substrate, which is not bonded to the light emitting diode layer.

The lens of the transparent substrate may be formed using a photolithography method or an imprinting method.

A polymer layer may be formed on the transparent substrate, and a lens of the transparent substrate may be formed in the polymer layer.

The opaque substrate may include a GaAs substrate.

The method may further include forming a separation layer between the opaque substrate and the light emitting diode layer, wherein the separation layer is selectively etched to separate the opaque substrate from the light emitting diode layer.

The whole opaque substrate may be removed by selectively etching the opaque substrate from the light emitting diode layer.

The method may further include forming an etching stopper layer between the opaque substrate and the light emitting diode layer.

The transparent substrate and the light emitting diode layer may be bonded using a spin on glass (SOG).

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
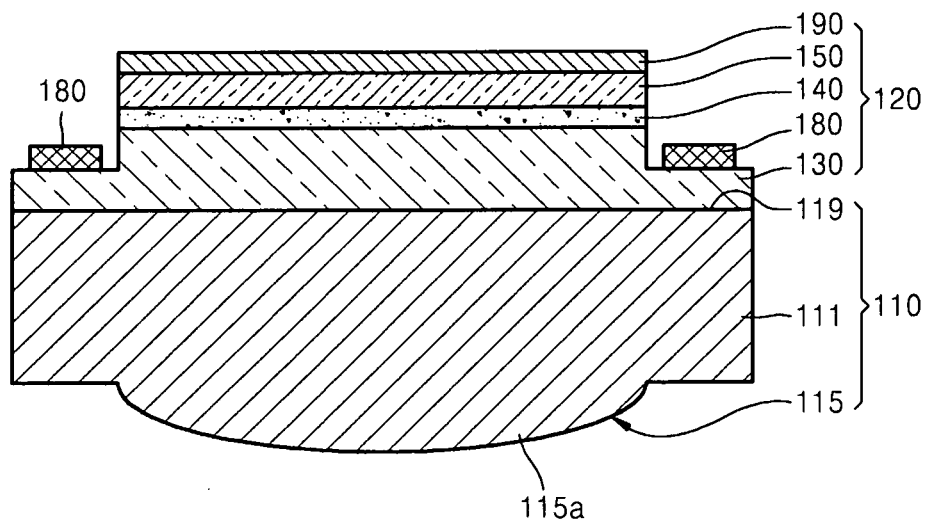
FIG. 1 is a side cross-sectional view illustrating a light emitting diode unit according to an embodiment.

Reference will now be made in detail to the embodiments, examples of which are illustrated in the accompanying drawings, wherein like reference numerals refer to the like elements throughout. The embodiments are described by referring to the figures.

The embodiments may be embodied in many different forms, and should not be construed as being limited to the embodiments set forth herein; rather, these embodiments are provided so that this disclosure will be thorough and complete, and will fully convey the concepts thereof to those of ordinary skill in the art.

FIG. 1 is a side cross-sectional view illustrating a light emitting diode unit according to an embodiment. Referring to FIG. 1, the light emitting diode unit includes a transparent substrate 110 and a light emitting diode 120 that is bonded to the transparent substrate 110.

The transparent substrate 110 includes a substrate bonding surface 119 on which the light emitting diode 120 is bonded and a lens surface 115 on which a lens 115a is formed. The lens 115a may be formed integrally with a body 111 of the transparent substrate 110. The transparent substrate 110 is formed of a material which is substantially transparent to light emitted from the light emitting diode 120. For example, when the light emitting diode 120 emits red light, the transparent substrate 110 may be formed of a material transparent to red light, such as glass, sapphire, GaP, plastic, or the like. The lens 115a refracts the light emitted from the light emitting diode 120 to collimate the light or focus the light on a predetermined point according to an optical design. As described above, since the light emitting diode unit according to this embodiment may be a chip emitting parallel light or focused light, the optical configuration of the light emitting diode unit when used in different apparatuses may be simplified, and the light emitting diode unit may be made compact. Furthermore, since the lens 115a is formed integrally with the body 111, a distance between the lens surface 115 and the light emitting diode 120 may be very close and uniform, and thus a light extraction efficiency of the light emitting diode 120 may be increased and uniformity of light beams emitted from the light emitting diode 120 may be maintained.

The light emitting diode 120 includes a first conductivity compound semiconductor layer 130 that is bonded to the transparent substrate 110, an active layer 140 formed on the first conductivity compound semiconductor layer 130, a second conductivity compound semiconductor layer 150 formed on the active layer 140, a first electrode layer 180 formed on a portion of the first conductivity compound semiconductor layer 130, and a second electrode layer 190 formed on the second conductivity compound semiconductor layer 150. The first and second electrode layers 180 and 190 are in ohmic contact with the first and second conductivity compound semiconductor layers 130 and 150, respectively, to supply electrons or holes, and may be formed of a metal having good conductivity. For example, the first and second electrode layers 180 and 190 may each be formed of a single layer. Alternatively, each of the layers 180 and 190 may be formed of two layers. The metals may be, for example, Au, Ni, Ti, Al, or the like. When the transparent substrate 110 is formed of a conductive material such as GaP, the transparent substrate 110 may function as an electrode for the first conductivity compound semiconductor layer 130, instead of the first electrode layer 180. The second electrode layer 190 covers an upper portion of the second conductivity compound semiconductor layer 150, thereby functioning as a reflection layer to reflect light emitted from the active layer 140.

The first conductivity compound semiconductor layer 130, the active layer 140, and the second conductivity compound semiconductor layer 150 are epitaxial layers which are formed by epitaxy. The first conductivity compound semiconductor layer 130 may be formed of, for example, an N-doped compound semiconductor, and the second conductivity compound semiconductor layer 150 may be formed of, for example, a P-doped compound semiconductor, or vice versa. The active layer 140 may be formed of a P-doped, N-doped, or non-doped compound semiconductor, and may have a single quantum well structure or a multiple quantum well structure. Holes or electrons supplied from the first and second conductivity compound semiconductor layers 130 and 150 recombine in the active layer 140, thereby emitting light.

A wavelength of light emitted from the light emitting diode 120 is determined according to energy band gaps of the epitaxial layers of the first conductivity compound semiconductor layer 130, the active layer 140, and the second conductivity compound semiconductor layer 150, and due to lattice mismatching of the eptaxial layers, a selection of the growth substrate on which the epitaxial layers are grown is limited. For example, a compound semiconductor that emits red light is usually epitaxially grown in a GaAs substrate, and the GaAs substrate is opaque to light having red wavelengths. The epitaxial layers may be crystalline grown in the GaAs substrate, and may be a compound semiconductor that emits red light; in detail, the epitaxial layers may be a GaAsP, AlGaAs, InGaP, or InGaAIP compound semiconductors. As will be described later, after the epitaxial layers are grown, the GaAs substrate is removed.

Figure 2:
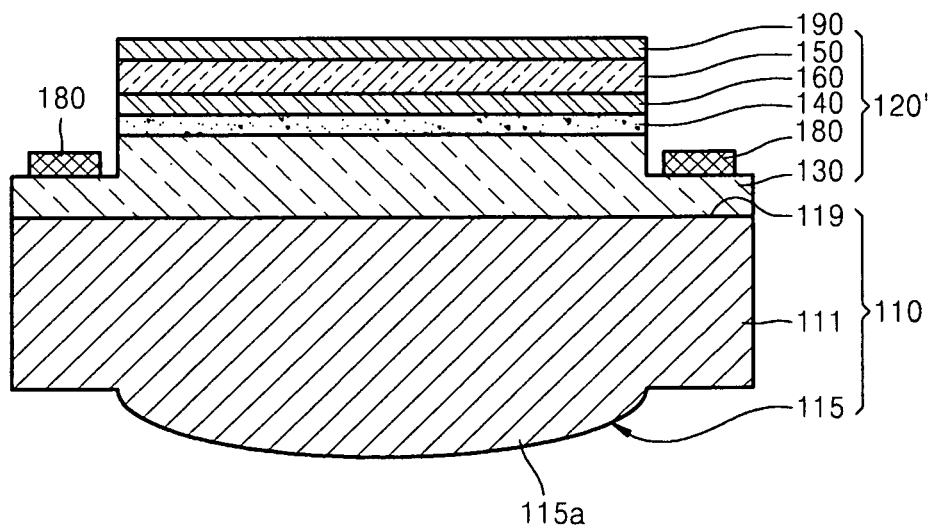
FIG. 2 is a side cross-sectional view illustrating a light emitting diode unit according to another embodiment.

FIG. 2 is a side cross-sectional view illustrating a light emitting diode unit according to another embodiment.

Referring to FIG. 2, the light emitting diode unit includes the transparent substrate 110 and a light emitting diode 120' that is bonded to the transparent substrate 110. The light emitting diode 120' includes the first conductivity compound semiconductor layer 130 that is bonded to the transparent substrate 110, the active layer 140 formed on the first conductivity compound semiconductor layer 130, the second conductivity compound semiconductor layer 150 formed on the active layer 140, a reflection layer 160 inserted between the active layer 140 and the second conductivity compound semiconductor layer 150, the first electrode layer 180 formed on a portion of the first conductivity compound semiconductor layer 130, and the second electrode layer 190 formed on the second conductivity compound semiconductor layer 150. The light emitting diode unit is substantially the same as that of the previous embodiment except that the reflection layer 160 is further formed in the light emitting diode 120', and therefore, not all of the elements are described again.

The reflection layer 160 reflects light that is isotropically emitted upwardly from the active layer 140 toward the transparent substrate 110, thereby increasing light extraction efficiency. The reflection layer 160 may be, for example, a distributed Bragg reflector (DBR) layer, which is formed of materials having different refractive indices and are alternately stacked. A DBR layer is well known in the art and thus description thereof will be omitted here. In FIG. 2, the reflection layer 160 is inserted between the active layer 140 and the second conductivity compound semiconductor layer 150; however the embodiments are not limited thereto and thus the reflection layer 160 may be inserted into the second conductivity compound semiconductor layer 150 or may also be formed on an upper surface of the second conductivity compound semiconductor layer 150.

Figure 3:
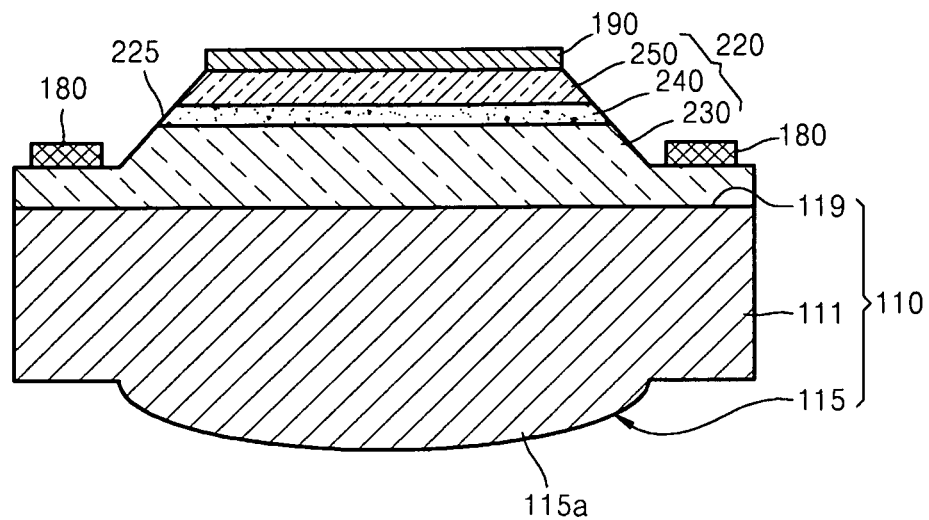
FIG. 3 is a side cross-sectional view illustrating a light emitting diode unit according to another embodiment.

FIG. 3 is a side cross-sectional view illustrating a light emitting diode unit according to another embodiment.

Referring to FIG. 3, the light emitting diode unit includes the transparent substrate 110 and a light emitting diode 220 bonded to the transparent substrate 110. The light emitting diode 220 includes a first conductivity compound semiconductor layer 230 bonded to the transparent substrate 110, an active layer 240 formed on the first conductivity compound semiconductor layer 230, a second conductivity compound semiconductor layer 250 formed on the active layer 240, the first electrode layer 180 formed on a portion of the first conductivity compound semiconductor layer 230, and the second electrode layer 190 formed on the second conductivity compound semiconductor layer 250. The light emitting diode unit of FIG. 3 is substantially the same as that of FIG. 1, except that the light emitting 220 has a truncated pyramid shape.

The light emitting diode 220 has an inclined surface 225 that reflects light emitted from the active layer 240 toward the transparent substrate 110, thereby improving light extraction efficiency. According to this embodiment, the light emitting diode 220 has a truncated pyramid shape, but is not limited thereto; the light emitting diode 220 may have various shapes for improving light extraction efficiency.

Figure 4:
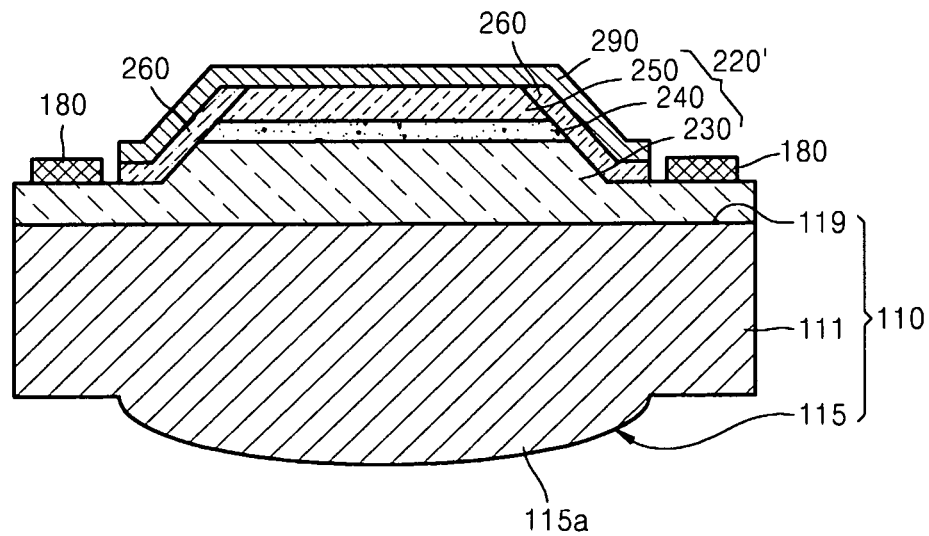
FIG. 4 is a side cross-sectional view illustrating a light emitting diode unit according to another embodiment.

FIG. 4 is a side cross-sectional view illustrating a light emitting diode unit according to another embodiment.

Referring to FIG. 4, the light emitting diode unit includes the transparent substrate 110 and a light emitting diode 220' bonded to the transparent substrate 110. The light emitting diode 220' includes the first conductivity compound semiconductor layer 230, the active layer 240, the second conductivity compound semiconductor layer 250, the first electrode layer 180, the second electrode layer 290, and an insulating layer 260. The second electrode layer 290 covers an upper surface of the first conductivity compound semiconductor layer 230, and also a side of the first conductivity compound semiconductor layer 230, the active layer 240, and the second conductivity compound semiconductor layer 250, except at a portion where the first electrode layer 180 formed. The second electrode layer 290 contacts a top surface of the second conductivity compound semiconductor layer 250. The insulating layer 260 is inserted beneath a portion of the second electrode layer 290 so that the insulating layer 260 insulates the second electrode layer 290 from the active layer 240 and the first conductivity compound semiconductor layer 230. The insulating layer 260 may be formed of an insulating material such as $SiO_2$. The light emitting diode unit according to this embodiment is substantially the same as the light emitting diode unit of FIG. 3, except that the insulating layer 260 is included in the light emitting diode 220' and that the second electrode layer 290 covers the light emitting diode 220' except at the portion where the first electrode layer 180 is formed.

As the second electrode layer 290 substantially covers an upper surface the light emitting diode 220' except the portion where the first electrode layer 180 is formed, light emitted from the active layer 240 is reflected by the second electrode layer 290 and proceeds toward the transparent substrate 110, thereby improving light extraction efficiency. To this end, the second electrode layer 180 may be formed of a metal having good reflection characteristics, and may be formed to have a sufficient thickness so that light is not transmitted therethrough.

Figure 5:
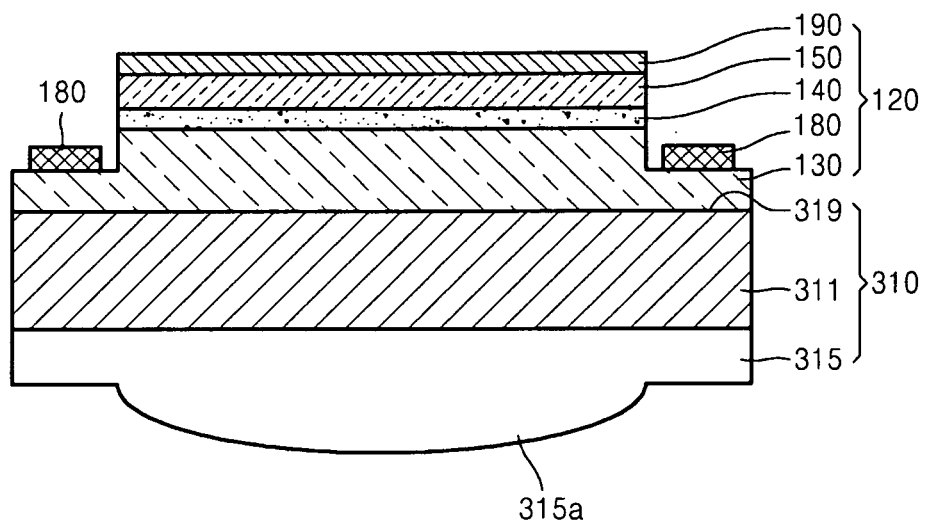
FIG. 5 is a side cross-sectional view illustrating a light emitting diode unit according to another embodiment.

FIG. 5 is a side cross-sectional view illustrating a light emitting diode unit according to another embodiment.

Referring to FIG. 5, the light emitting diode unit includes a transparent substrate 310 including a lens layer 315, and the light emitting diode 120 bonded to the transparent substrate 310. The light emitting diode 120 includes the first conductivity compound semiconductor layer 130 that is bonded to the transparent substrate 310, the active layer 140 formed on the first conductivity compound semiconductor layer 130, the second conductivity compound semiconductor layer 150 formed on the active layer 140, the first electrode layer 180 formed on a portion of the first conductivity compound semiconductor layer 130, and the second electrode layer 190 formed on the second conductivity compound semiconductor layer 150. The light emitting diode unit according to this embodiment is substantially the same as the light emitting diode unit of FIG. 1, except that the transparent substrate 310 further includes the lens layer 315.

A body 311 of the transparent substrate 310 includes a substrate bonding surface 319 that contacts the first conductivity compound semiconductor layer 130, and another surface that contacts the lens layer 315. The body 311 may be formed of a material such as glass, sapphire, GaP, or plastic. The lens layer 315 may be formed of polymer with which a lens 315a may be easily formed. For example, when the lens layer 315 is formed of polymer, which can be formed using a low temperature process, the shape of the lens 315a may be formed using an imprinting process after the transparent substrate 310 and the light emitting diode 120 are bonded to each other.

Figure 6:
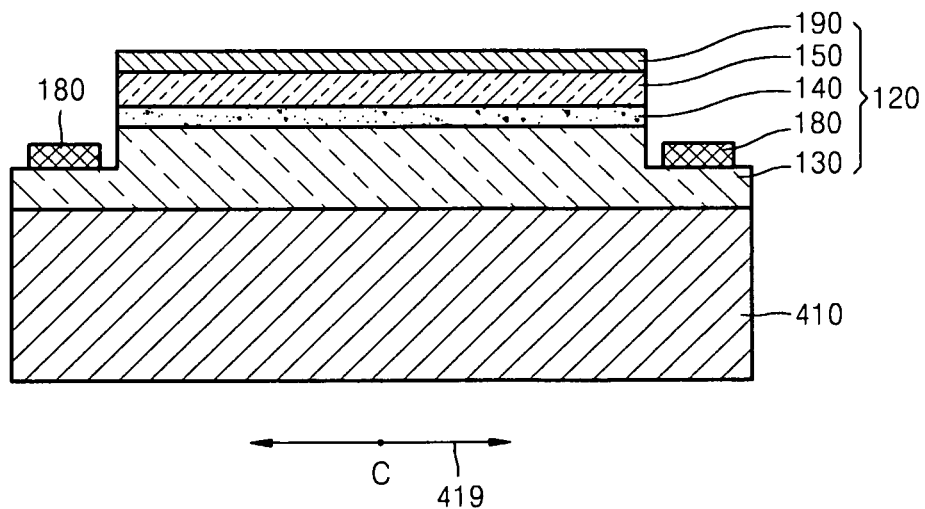
FIG. 6 is a side cross-sectional view illustrating a light emitting diode unit according to another embodiment.

FIG. 6 is a side cross-sectional view illustrating a light emitting diode unit according to another embodiment.

Referring to FIG. 6, the light emitting diode unit includes a transparent substrate 410 and the light emitting diode 120 that is bonded to the transparent substrate 410. The light emitting diode 120 includes the first conductivity compound semiconductor layer 130 that is bonded to the transparent substrate 410, the active layer 140 formed on the first conductivity compound semiconductor layer 130, the second conductivity compound semiconductor layer 150 formed on the active layer 140, the first electrode layer 180 formed on a portion of the first conductivity compound semiconductor layer 130, and the second electrode layer 190 formed on the second conductivity compound semiconductor layer 150. The light emitting diode unit according to this embodiment is substantially the same as the light emitting diode unit of FIG. 1, except for the transparent substrate 410.

The transparent substrate 410 is a flat lens having refractive power as a refractive index thereof is partially modulated. For example, impurities are diffused in a diameter direction 419 around a center C of the transparent substrate 410 to partially modulate a refractive index of the transparent substrate 410 so that the transparent substrate 410 has refractive power.

Figure 7:
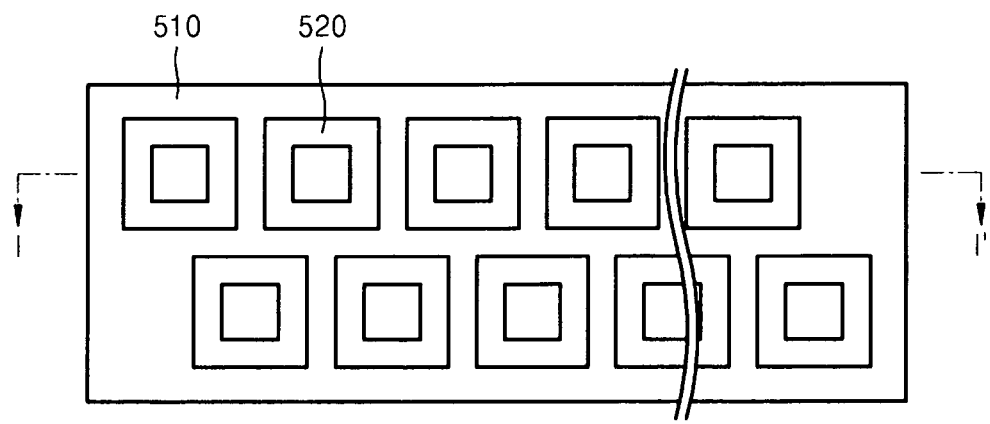
FIG. 7 is a top view of a portion of a line printer head light according to another embodiment.
Figure 8:
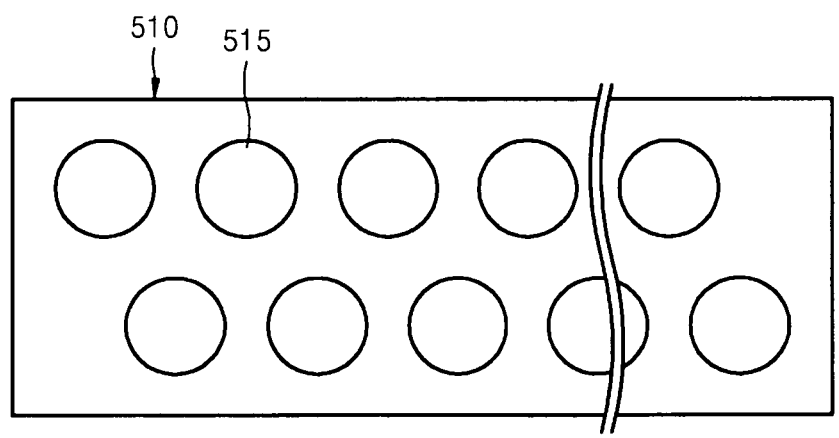
FIG. 8 is a bottom view of the line printer head of FIG. 7.
Figure 9:
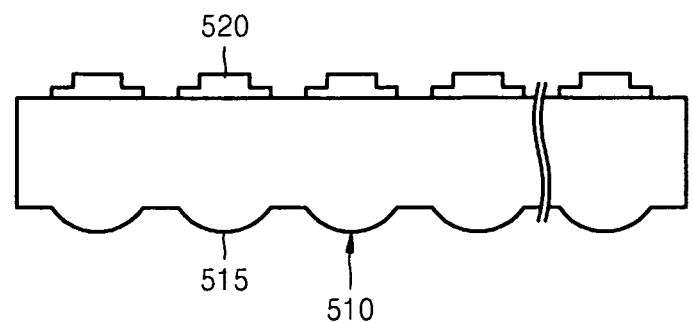
FIG. 9 is a side cross-sectional view of the line printer head of FIG. 7, taken along a line I-I'.

FIG. 7 is a top view of a portion of a line printer head according to another embodiment, FIG. 8 is a bottom view of the line printer head of FIG. 7, and FIG. 9 is a side cross-sectional view of the line printer head of FIG. 7, taken along a line I-I'.

Referring to FIGS. 7 through 9, the line printer head has an array structure in which light emitting diodes 520 are arranged in two rows on an upper surface of a transparent substrate 510. Also, lenses 515 are formed on a lower surface of the transparent substrate 510 to correspond to the light emitting diodes 520. For example, the light emitting diodes 520 may each have a width of several tens of microns, and be arranged at intervals of several tens of microns. Also, a distance between the two rows of the light emitting diodes 520 may also be several tens of microns or less. The lenses 515 may also each have a width of several tens of microns and be arranged at intervals of several tens of microns to correspond to the size of the light emitting diodes 520. The lenses 515 having a width of several tens of microns are referred to as a micro-lens array, and a method of manufacturing the micro-lens array is known well in the art.

In the line printer head, the two rows of the light emitting diodes 520 may be alternately arranged so that one row fills gaps of the other and so that light beams emitted from each of the light emitting diodes 520 may be accordingly densely emitted at equal distances without any gap due to the separation of the light emitting diodes 520 with respect to a side view. For example, light beams emitted from each of the light emitting diodes 520 may be emitted at intervals of several tens of microns. A thousand of the light emitting diodes 520 are arranged on one transparent substrate 510. Accordingly, the line printer head according to the embodiment of FIG. 7 may be used as a line printer head of an image forming apparatus, as will be described later.

According to the embodiment of FIG. 7, two rows of the light emitting diodes 520 are arranged, but the embodiment is not limited thereto. Alternatively, one row of the light emitting diodes 520 or three rows of the light emitting diodes 520 may be arranged, or the light emitting diodes 520 may also be disposed in another predetermined pattern.

Next, a method of manufacturing a light emitting diode, according to an embodiment, will be described.

FIGS. 10A through 10E illustrate a method of manufacturing a light emitting diode unit, according to an embodiment.

Figure 10A:
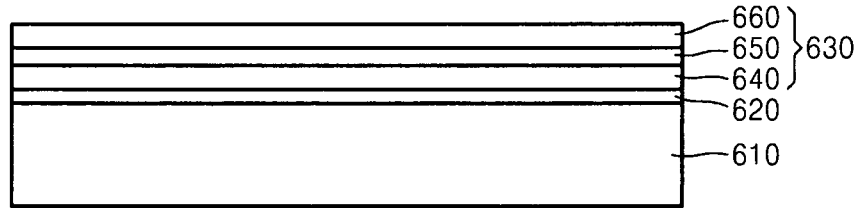
FIGS. 10A, 10B, 10C, 10D and 10E illustrate a method of manufacturing a light emitting diode unit, according to an embodiment.

Referring to FIG. 10A, epitaxial layers 630 are grown on an opaque substrate 610. The epitaxial layers 630 are formed by sequentially stacking a second conductivity compound semiconductor layer 640, an active layer 650, and a first conductivity compound semiconductor layer 660 on the opaque substrate 610. The epitaxial layers 630 may be grown by using a method such as a metal organic chemical vapor deposition (MOCVD) method, a molecular beam epitaxy (MBE) method, or a metal organic molecular beam epitaxy (MO-MBE) method and using a compound semiconductor epitaxy apparatus.

Before growing the epitaxial layers 630, a separation layer 620 may be formed on the opaque substrate 610. The separation layer 620, for example, AlAs, may be formed of a material having a higher etching selectivity than the epitaxial layers 630. As will be described later, the separation layer 620, e.g., a sacrificial layer or an etching stopper layer, may function as a layer separating the opaque substrate 610 and the epitaxial layers 630.

Figure 10B:
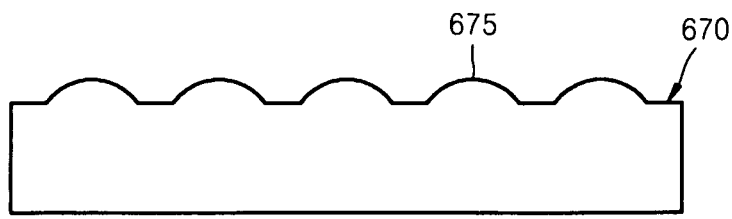

Also, referring to FIG. 10B, a transparent substrate 670 having a lens 675 formed thereon is formed. The transparent substrate 670 may be formed of, for example, glass, plastic, or polymer. The lens 675 may be formed with, for example, a fusion molding method. Alternatively, the lens 675 may be formed on the transparent substrate 670 by using a photolithography method or an imprinting method. In FIG. 10B, the lens 675 is formed by processing a surface of the transparent substrate 670 as a lens surface having a predetermined curvature, but is not limited thereto. For example, a flat lens may be formed on the transparent substrate 670 by partially modulating a refractive index of transparent substrate 670 by diffusing impurities into the transparent substrate 670.

Figure 10C:
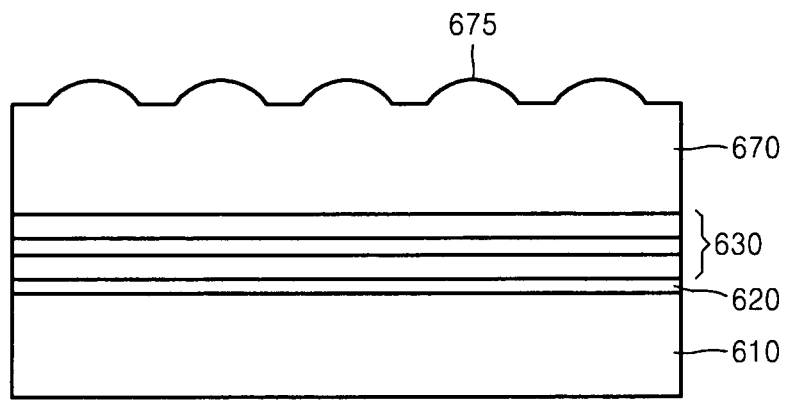

Next, referring to FIG. 10C, an upper surface of the epitaxial layers 630 grown on the opaque substrate 610 is bonded to a surface of the transparent substrate 670 other than the surface thereof on which the lens 675 is formed. The upper surface of the epitaxial layers 630 may be bonded to the surface of the transparent substrate 670 by using, for example, heat and pressure. The surface of the transparent substrate 670 on which the lens 675 is not formed or the upper surface of the epitaxial layers 630 may be coated with a spin on glass (SOG) to facilitate the bonding.

Figure 10D:
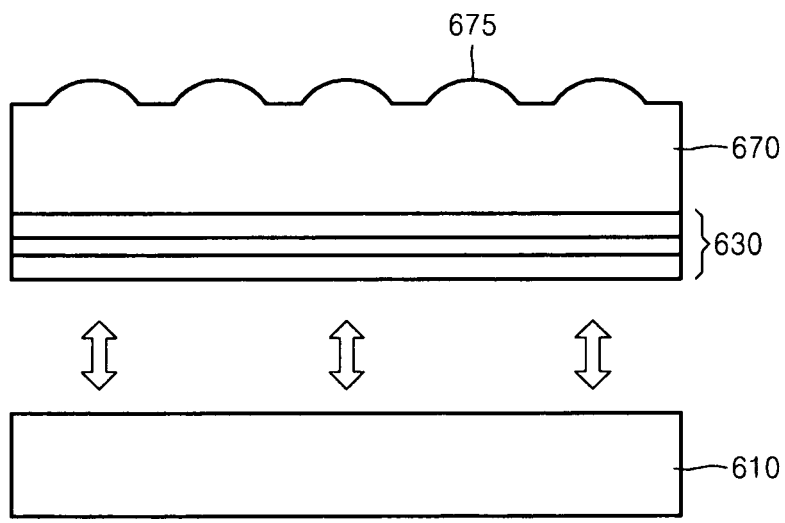

Next, referring to FIG. 10D, the opaque substrate 610 is separated from the epitaxial layers 630 which are bonded to the transparent substrate 670. For example, by using a difference in etching selectivities of the opaque substrate 610 and the epitaxial layers 630, the whole opaque substrate 610 is etched, thereby removing the opaque substrate 610. Alternatively, by removing the separation layer 620 by using a difference in the etching selectivities of the separation layer 620 and the epitaxial layers 630 and the opaque substrate 610, the opaque substrate 610 may be separated from the epitaxial layers 630.

Figure 10E:
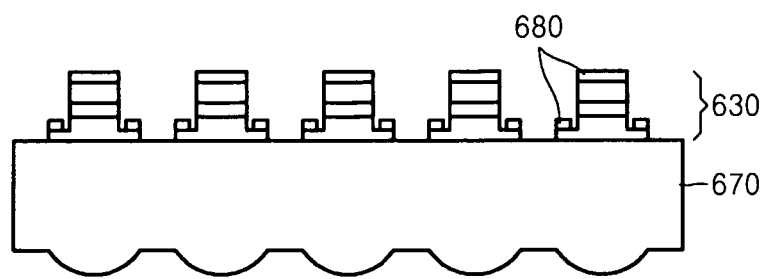

Next, referring to FIG. 10E, the epitaxial layers 630 are formed into individual light emitting units by performing a photolithography process and a metal patterning process, thereby forming a plurality of electrode structures 680.

FIGS. 11A through 11E illustrate a method of manufacturing a light emitting diode unit according to another embodiment.

Figure 11A:
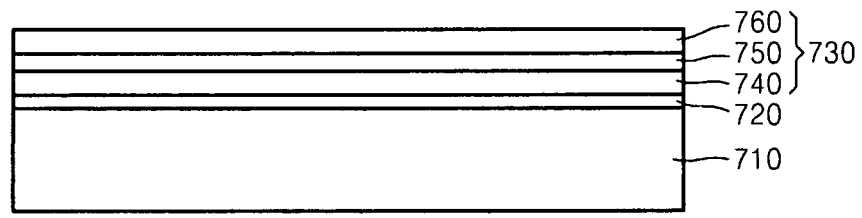
FIGS. 11A, 11B, 11C, 11D, 11E and 11F illustrate a method of manufacturing a light emitting diode unit, according to another embodiment.

Referring to FIG. 11A, epitaxial layers 730 are grown on an opaque substrate 710. The epitaxial layers 730 are formed by sequentially stacking a separation layer 720, a second conductivity compound semiconductor layer 740, an active layer 750, and a first conductivity compound semiconductor layer 760 on the opaque substrate 710. The above operations are substantially the same as described with reference to FIG. 10A.

Figure 11B:
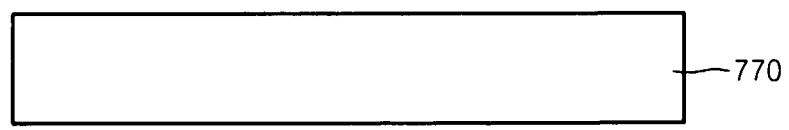

Also, as illustrated in FIG. 11B, a flat transparent substrate 770 is provided. The transparent substrate 770 may be formed of, for example, glass, plastic, or polymer.

Figure 11C:
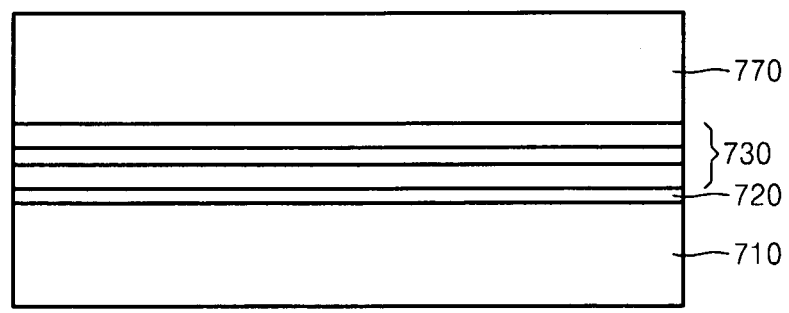

Next, as illustrated in FIG. 11C, an upper surface of the epitaxial layers 730 grown on the opaque substrate 710 is bonded to the transparent substrate 770. The bonding may be performed by using, for example, heat and pressure.

Figure 11D:
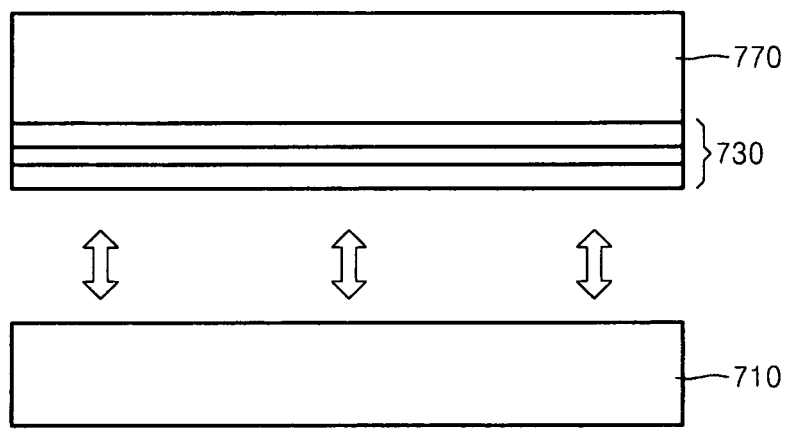

Next, as illustrated in FIG. 11D, the opaque substrate 710 is separated from the epitaxial layers 730 bonded to the transparent substrate 770. The separation layer 720 may be used as an etching stopper layer or a sacrificial layer.

Figure 11E:
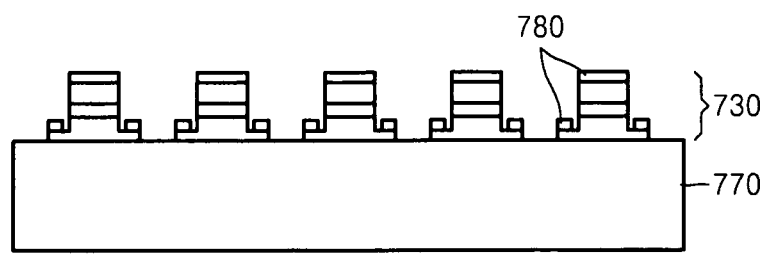

Next, as illustrated in FIG. 11E, a photolithography process and a metal patterning process are performed on the epitaxial layers 730 to form the epitaxial layers 730 into individual light emitting units and thus form a plurality of electrode structures 780.

Figure 11F:
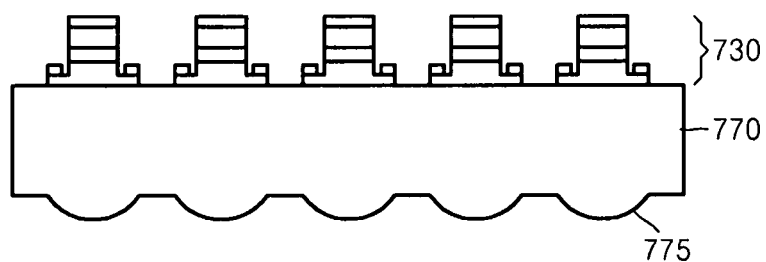

Next, as illustrated in FIG. 11F, a plurality of lenses 775 are formed on a surface of the transparent substrate 770, which is not bonded to the epitaxial layers 730. The lens 775 may be formed by using, for example, a photolithography process or an imprinting process. Alternatively, a surface of the transparent substrate 770, which is not bonded to the epitaxial layers 730, may be coated with a transparent polymer and then the transparent polymer may be processed to form a lens surface by using an imprinting process.

Figure 12:
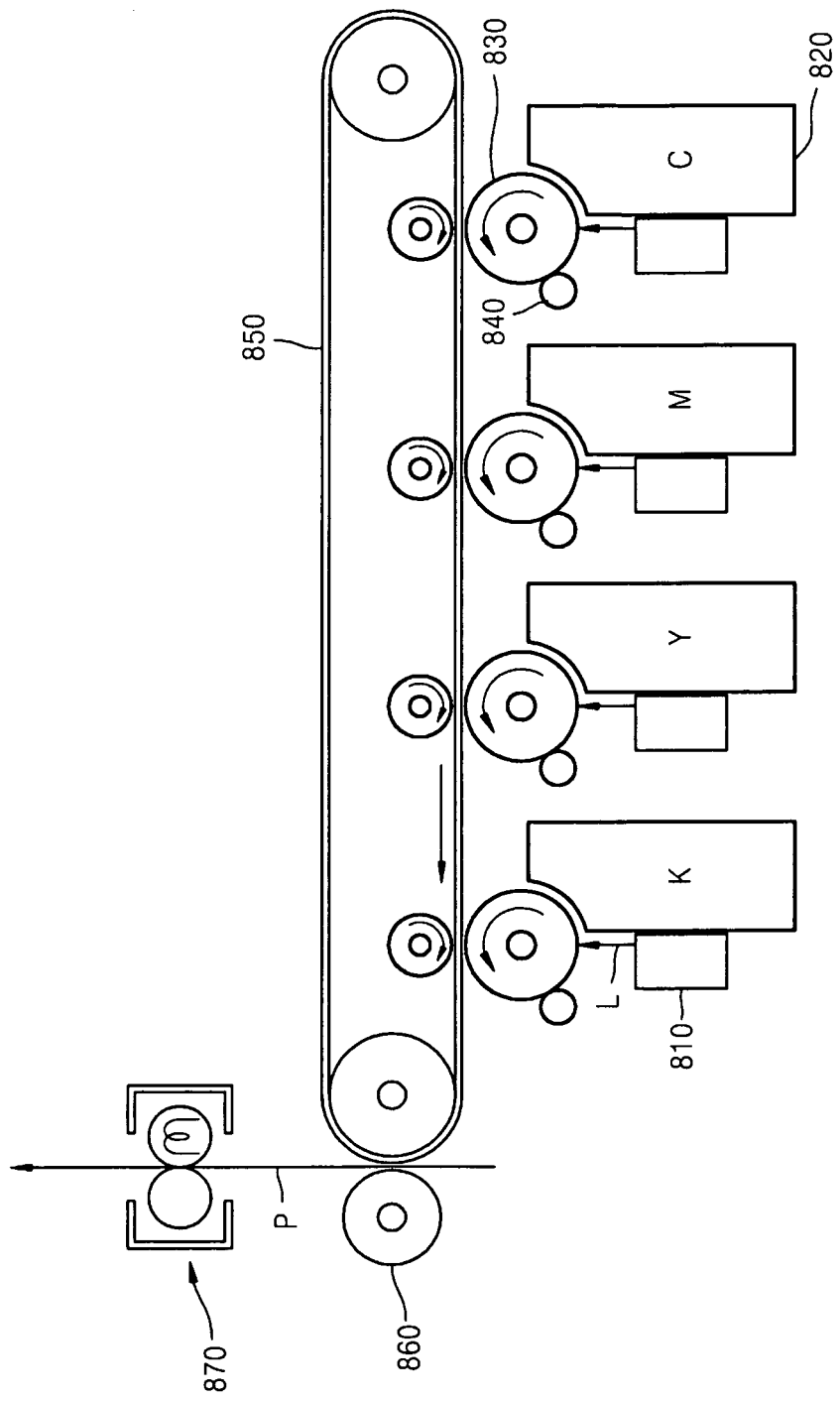
FIG. 12 is a schematic diagram illustrating an image forming apparatus in which a light emitting diode according to an embodiment is used in a line printer head.
Figure 13:
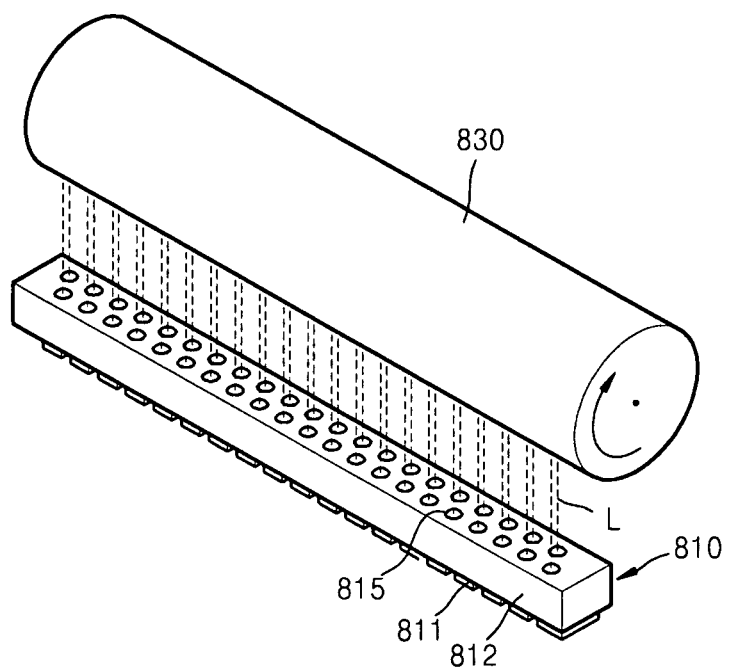
FIG. 13 is a perspective view illustrating one of the line printer heads and one of a plurality of photosensitive drums of the image forming apparatus of FIG. 12.

FIG. 12 is a structural diagram illustrating an image forming apparatus in which an array of light emitting diodes according to embodiments is used in a line printer head 810. FIG. 13 is a perspective view illustrating one of the line printer heads 810 and one of a plurality of photosensitive drums 830 of the image forming apparatus of FIG. 12.

Referring to FIG. 12, the image forming apparatus may include the line printer heads 810, developing units 820, the photosensitive drums 830, charging rollers 840, an intermediate transfer belt 850, a transfer roller 860, and a fixing unit 870.

The line printer head 810 illustrates on the photosensitive drum 830 linear light L that is modulated according to image information, and may include the light emitting diode unit according to the above-described embodiments. The photosensitive drum 830 is an example of a photoreceptor, and includes a photosensitive layer having a predetermined thickness on an outer circumferential surface of a cylinder metal pipe. The outer circumferential surface of the photosensitive drum 830 is an exposed surface whereon the light L illustrated by the line printer head 810 forms an image. Also, a belt-type photosensitive belt may be used as a photoreceptor. A corresponding charging roller 840 is rotated while contacting the photosensitive drum 830 and charges the surface of the photosensitive drum 830 to a uniform electric potential. A charging bias voltage Vc is applied to the corresponding charging roller 840. A corona charger (not shown) may be used instead of the corresponding charging roller 840. Toner is contained in a corresponding developing unit 820. The toner is transported to the photosensitive drum 830 in response to a developing bias voltage applied between the corresponding developing unit 820 and the photosensitive drum 830 and develops an electrostatic latent image into a visible toner image. The visible toner image formed on the photosensitive drum 830 is transferred to the intermediate transfer belt 850. The toner image is then transferred to a paper P that is transported between the transfer roller 860 and the intermediate transfer belt 850 by applying a transfer bias voltage to the charging rollers 840. The toner image transferred to the paper P is fixed on the paper P by heat and pressure from the fixing unit 870, thereby completing formation of an image.

In order to print a color image, each of the line printer heads 810, each of the developing units 820, and each of the photosensitive drums 830 corresponding to one color are included. The line printer heads 810 respectively scan four light beams to the four photosensitive drums 830. In the four photosensitive drums 830, electrostatic latent images corresponding to image information of black (K), magenta (M), yellow (Y), and cyan (C) are formed. The four developing units 820 supply toner of black (K), magenta (M), yellow (Y), and cyan (C) colors to the photosensitive drums 830 to form toner images of black (K), magenta (M), yellow (Y), and cyan (C). The toner images of black (K), magenta (M), yellow (Y), and cyan (C) are transferred to the intermediate transfer belt 850 and overlapped thereon, and then are transferred to the paper P again.

Referring to FIG. 13, the line printer heads 810 are disposed from several to several tens of millimeters away from the photosensitive drums 830, and emit a plurality of light beams L arranged in a main scanning direction onto an outer circumferential surface of the photosensitive drums 830 according to image information. The line printer head 810 exposes the photosensitive drum 830 line-by-line, and a two-dimensional electrostatic latent image is formed on the outer circumferential surface of the photosensitive drum 830 as the photosensitive drum 830 is rotated.

The line printer head 810 may have a structure as illustrated in FIGS. 7 through 9. That is, in the line printer head 810, a plurality of light emitting diodes 811 are bonded to a transparent substrate 812, and a plurality of micro-lenses 815 are arranged on the transparent substrate 812 to correspond to the plurality of the light emitting diodes 811, respectively. Light beams are emitted through the plurality of micro-lenses 815 at equal distances, and may be focused on the outer circumferential surface of the photosensitive drum 830 according to the optical design of the micro-lenses 815. According to conventional designs, a light beam emitted from the light emitting diode 811 has a large luminous view angle and is thus diverged, and in order to collimate or focus a plurality of the light beams that are usually arranged at several tens of microns, an expensive optical device such as a rod lens array (RLA) is needed. However, in the line printer head 810, as a plurality of the micro-lenses 815 are arranged on the transparent substrate 812, no optical unit is required. Accordingly, a simple light scanning optical system may be realized with reduced manufacturing costs. Also, since the line printer head 810 having a compact size may be manufactured, the degree of freedom of a system design of an image forming apparatus may also be increased.

According to the light emitting diode unit of the embodiments, light emitted from the light emitting diodes may proceed parallel or be efficiently focused at a predetermined distance. In addition, distances between the lens and the light emitting diodes may be kept as close as possible to a thickness of the transparent substrate and uniform. Thus, the light beam extraction efficiency of the light emitting diode may be increased and the uniformity of light beams emitted therefrom may be maintained.

According to the line printer head using the light emitting diode unit according to the embodiments, light may be focused on a scanning surface without using an RLA. Also, when the light emitting diode unit according to the embodiments is used in a line printer head, no RLA is required, and thus the manufacturing costs of the line printer head may be significantly reduced, and the size of the line printer head may also be reduced, thereby increasing the degree of freedom of a system design of a printer.

Also, according to the method of manufacturing the light emitting diode unit of the embodiments, a light emitting diode integrated with a lens may be manufactured in one process, thereby reducing manufacturing costs.

Although a few embodiments have been shown and described, it would be appreciated by those skilled in the art that changes may be made in these embodiments without departing from the principles and spirit of the embodiments, the scope of which is defined in the claims and their equivalents.

What is claimed is:

1. A line printer head, comprising:
   a transparent substrate;
   a plurality of the light emitting diodes bonded to the transparent substrate; and
   a lens that refracts light emitted from the plurality of light emitting diodes, the lens being formed on or integral with the transparent substrate,
   wherein the plurality of light emitting diodes comprises a first electrode layer and a second electrode layer, wherein the second electrode layer further acts as a reflective layer;
   wherein each of the plurality of light emitting diodes has the first electrode layer disposed on opposite sides of the light emitting diode and the second electrode layer located between the first electrodes;
   wherein the transparent substrate comprises a substrate bonding surface; and
   wherein each of the plurality of light emitting diode comprises:
   a first conductivity compound semiconductor layer bonded directly on the substrate bonding surface of the transparent substrate;
   an active layer formed on the first conductivity compound semiconductor layer; and
   a second conductivity compound semiconductor layer formed on the active layer.

2. The line printer head of claim 1, wherein the plurality of light emitting diodes are arranged in a row or in a plurality of rows.

3. The line printer head of claim 1, wherein the lens comprises a micro-lens array which corresponds to the light emitting diodes that are arranged on the transparent substrate.

4. The line printer head of claim 1, wherein the line printer head exposes a photoreceptor.

5. The line printer head of claim 1, wherein each of the plurality of light emitting diodes comprises a compound semiconductor layer that is grown on an opaque substrate and then separated from the opaque substrate.

6. The line printer head of claim 5, wherein the opaque substrate comprises a GaAs substrate.

7. The line printer head of claim 1, wherein each of the plurality of light emitting diode emits red light.

8. The line printer head of claim 1, further comprising a reflection layer, wherein the light emitting diode is covered by the reflection layer.

9. The line printer head of claim 8, wherein each of the plurality of light emitting diode further comprises:
   the first electrode layer formed on a portion of the first conductivity compound semiconductor layer; and
   the second electrode layer formed on the second conductivity compound semiconductor layer.

10. The line printer head of claim 9, wherein the second electrode layer covers a portion of the first conductivity compound semiconductor layer where the first electrode layer is not formed, the light emitting diode unit further comprising:
    an insulating layer provided beneath the second electrode layer at a portion where the second electrode layer does not contact an upper surface of the second conductivity compound semiconductor layer.

11. The line printer head of claim 9, further comprising a reflection layer inserted into the second conductivity compound semiconductor layer.

12. The line printer head of claim 1, wherein the light emitting diode comprises a truncated pyramid shape.

13. The line printer head of claim 1, wherein a surface of the transparent substrate is curved and the lens has refractive power according to the curve of the transparent substrate.

14. The line printer head unit of claim 1, wherein the lens is formed of a polymer layer by molding the polymer layer and attaching the polymer layer to the transparent substrate.

15. The line printer head unit of claim 1, wherein the transparent substrate has impurities having different densities according to positions in the transparent substrate and the lens has refractive power according to the impurities in the transparent substrate.

16. The line printer head of claim 15, wherein the lens is a flat lens.

17. The line printer head of claim 1, wherein the transparent substrate comprises a body between the first conductivity compound semiconductor layer and the lens.

* * * * *

UNITED STATES PATENT AND TRADEMARK OFFICE
CERTIFICATE OF CORRECTION

PATENT NO.        : 9,278,545 B2
APPLICATION NO.   : 12/805893
DATED             : March 8, 2016
INVENTOR(S)       : Seok-jin Kang et al.

Page 1 of 1

It is certified that error appears in the above-identified patent and that said Letters Patent is hereby corrected as shown below:

In the Claims

Claim 14, Column 12, Line 49:
Please delete "line printer head unit" and insert -- line printer head --, therefor.

Claim 15, Column 12, Line 52:
Please delete "line printer head unit" and insert -- line printer head --, therefor.

Signed and Sealed this
Second Day of August, 2016

Michelle K. Lee
*Director of the United States Patent and Trademark Office*